United States Patent

[11] 3,549,784

[72] Inventor Billy M. Hargis
Cleveland, Tenn.
[21] Appl. No. 702,421
[22] Filed Feb. 1, 1968
[45] Patented Dec. 22, 1970
[73] Assignee American Lava Corporation
Chattanooga, Tenn.
a corporation of Tennessee

[54] CERAMIC-METALLIC COMPOSITE SUBSTRATE
2 Claims, 10 Drawing Figs.

[52] U.S. Cl. .......... 174/68.5, 29/625, 317/101

[51] Int. Cl. .......... H05k 1/02, H05k 3/22

[50] Field of Search .......... 174/68.5; 317/101B, 101CM, 101P; 29/625, 626, 627; 117/38; 65/(Inquired)

[56] References Cited

UNITED STATES PATENTS

| | | | |
|---|---|---|---|
| 2,721,822 | 10/1955 | Pritikin | 317/101B |
| 3,423,517 | 1/1969 | Arrhenius | 174/68.5 |
| 2,711,983 | 6/1955 | Hogt | 174/68.5 |
| 3,085,899 | 4/1963 | Forman | 117/38 |
| 3,189,978 | 6/1965 | Stetson | 174/68.5X |

*Primary Examiner*—Darrell L. Clay
*Attorney*—Kinney, Alexander, Sell, Steldt & DeLaHunt

ABSTRACT: Thin multilayer ceramic substrates are formed by screening layers of metallic conductive patterns, e.g., of tungsten, molybdenum or manganese, and ceramic insulative layers, e.g., alumina, on fired or unfired ceramic bases. After all the layers have been deposited the substrates are fired to unify the ceramic. Interconnections are provided between layers of conductors by screening insulative layers with small openings over conductors in the layer below. The superposed conductive layers fill the openings and connect to the lower layers without possibility of running over and shorting to adjacent conductors. When unfired bases are used for applying the several layers, shrinkages and warping which may occur from differences in behavior of metallic ink and ceramic are overcome by applying a balancing layer of the same metallic ink on the other side of the base so that the balancing layer has the same general area and thickness as the patterns of electrical conductors. The balancing layer may be electrically isolated. The multilayer substrates provide buried crossovers and conductors and mounting positions for various electronic circuit chips etc. in small volume.

INVENTOR
BILLY M. HARGIS
BY Kinney, Alexander,
Sell, Steldt & De La Hunt
ATTORNEYS INVENTOR.
BILLY M. HARGIS
BY Kinney, Alexander,
Sell, Steldt & De La Hunt
ATTORNEYS

CERAMIC-METALLIC COMPOSITE SUBSTRATE

This invention relates to multilayer arrays of conductors and methods and materials for the manufacture thereof. Particularly, the invention relates to multilayer arrays of metallic conductors comprised within a monolithic ceramic body in two or more layers thereof with interconnections between layers embedded within the ceramic structure. The invention further relates to means for balancing distortion on firing of monolithic ceramic multilayer arrays of conductors by incorporation of one or more usually metallic camber control planes positioned so as to balance distortion either as surface or buried or as electrically isolated or functional layers.

Multilayer structures based on assembling several separately prepared conductor patterns have been known. Several patterns may be screened simultaneously on one base and then separated and reassembled in laminated relationship as described by Stetson, U.S. Pat. No. 3,189,978, after the punching of suitable holes and refilling of the holes with metallic paste to enable the establishment of interconnections between layers. Interconnections will then depend upon securing contact and consolidation between the metallic paste in superposed holes. One disadvantage of such a procedure is that extra steps are necessary to refill the holes with paste. Obviously, failing to do this correctly may result in many defective pieces which may not be detected readily, particularly if the connection is completely hidden. There is also the possibility of overflow into the bottom surface which may create electrical shorts. A further disadvantage is that the thickness of the ceramic base sheet imposes inherent limitations on the thickness of insulating layers. For example, if all circuits are prepared on the same base, all ceramic layers will be of the same thickness. To avoid this requires preparation of several different circuit pieces and then assembling correctly. Misalignment may occur and be difficult to detect.

It is an aim of this invention to provide multilayer arrays of conductors and particularly metallic conductors in which ceramic layers are of variable thickness in proportion to the needs for thicker layers for mechanical support and relatively thin insulative layers. A further aim of this invention is to interconnect layers in a ceramic electrical harness during the production without added process steps. Other aims will become evident from the specification, claims and drawing herewith.

It has been found in accordance with these and other aims of the invention that multiple conductors are conveniently prepared on ceramic bases by screening, i.e., "screen-printing," of patterns of conductors at each of several layers or strata with insulative layers or strata interposed, having openings at positions at which interconnections are desired or at which connections to leads are desired. A stainless steel screen of about 165 to 400 mesh is conveniently used. A particular advantage of the invention is that positive insulation is provided between parallel circuits because there is positive ceramic bond between insulative layers except where metallic conductors or planes are provided. The ceramic structure is thus essentially unified. Conveniently, openings for the mounting and connection of monolithic electronic circuit chips are provided simultaneously. Bases for attachment of covers or other encapsulation means may also be provided in the same manner. The invention is now further described by reference to the attached drawings which are illustrative of the invention.

The FIGS. show the successive levels of a composite substrate of the invention. In actual practice much smaller sizes are used. Underlying layers are not generally shown in order to simplify the drawings.

FIG. 1 shows a ceramic base sheet.

FIG. 1*a* shows a metallic pattern applied to the underside of the ceramic base sheet of FIG. 1 providing a seal area.

Figure 5:
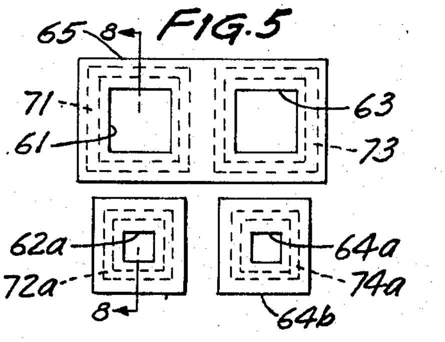
FIG. 5 shows an insulative layer in several pieces applied over the metallic pattern of FIG. 4 to bury and protect certain connections and to provide a base for metallized bands which accept covers for hermetic sealing of the chip area.
Figure 6:
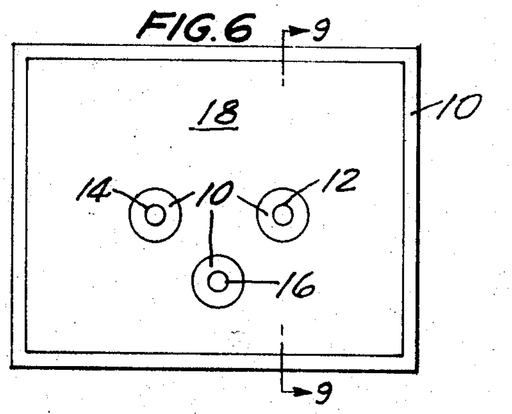
FIG. 6 shows a metallic layer applied to counterbalance deformation process.
Figure 7:
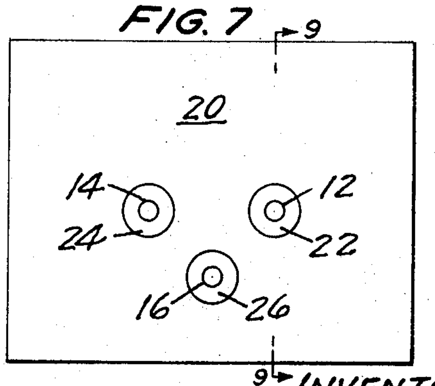
FIG. 7 shows an insulative layer and metallic pattern applied over the counterbalancing layer of FIG. 6.
Figure 9:
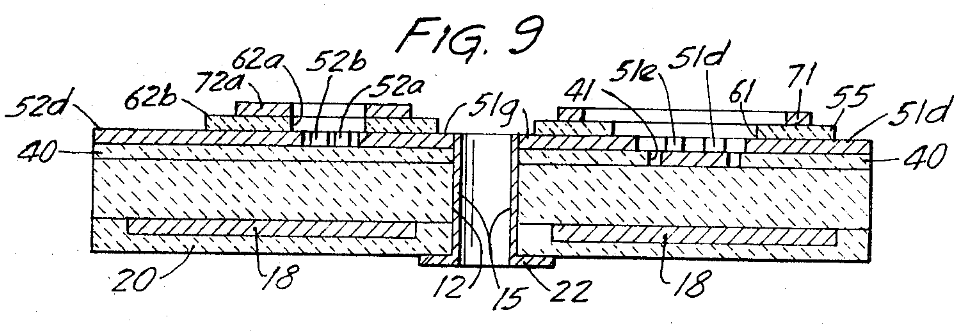

FIG. 9 shows an enlarged cross section through a substrate containing the layers of FIGS. 1, 2, 3, 4 and 5 sectioned along lines 8—8 of FIGS. 6 and 7 sectioned along lines 9—9.

Figure 8:
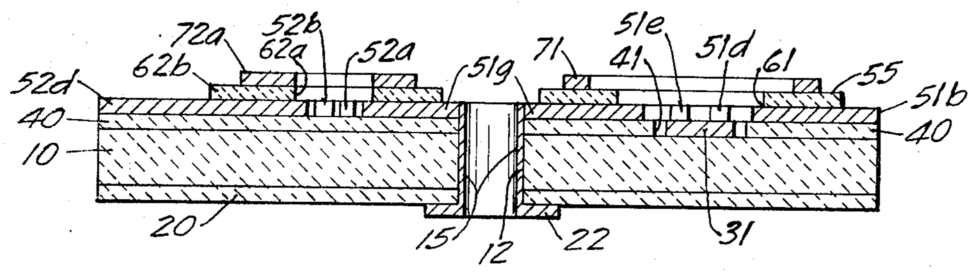
FIG. 8 shows an enlarged cross section through a substrate containing the layers of FIGS. 1, 1*a*, 2, 3, 4 and 5 sectioned along the lines 8—8 of the figures.

The specific article illustrated and shown in cross section in FIG. 8 consists of the superposed assemblage of ceramic and metallic patterns of FIGS. 1, 1*a*, 2, 3, 4 and 5. The layers of FIGS. 6 and 7 are also included in certain embodiments as will become evident hereinbelow and as shown in cross section in FIG. 9. It will be recognized that the invention is not in the specific organization of circuits which are intended to illustrate some of the various methods of connecting terminals through and/or over various combinations of ceramic materials utilizing metallic patterns and insulative layers laid down by screening. The construction and method of carrying out the invention is more specifically illustrated in the following description.

A ceramic base is prepared, suitably by the procedure of Park, U.S. Pat. No. 2,966,719, from alumina containing a few percent of talc in a polyvinyl butyral binder. Thus 100 parts of a mixture of about 90 parts of −325 mesh (U.S. Standard) alumina, with additions of talc clay and calcium carbonate to give 94—95 percent alumina in the final fired body, is ballmilled for several hours with 2 to 5 parts by weight of polyvinyl butyral, 2 to 5 parts by volume of triethylene glycol hexoate or other compatible plasticizer, 0.2 part by volume of compatible wetting agent, e.g. polyalkylene glycol monoalkyl ether and about 30 parts by volume of toluene (or other suitable solvent). The resultant slip is deaired and coated to uniform predetermined thickness (e.g. by knife-coating) on a smooth carrier. For this purpose regenerated cellulose available as Cellophane is suitable and relatively inexpensive. Other carriers having sufficient smoothness are also satisfactory.

It will be evident that this invention is not limited solely to alumina of any particular purity but may be practiced with alumina of greater or lesser purity than described above as well as with beryllia of various purities, and with other ceramic materials possessing desired strength and electrical and thermal properties after firing, such as titanates.

Figure 1:
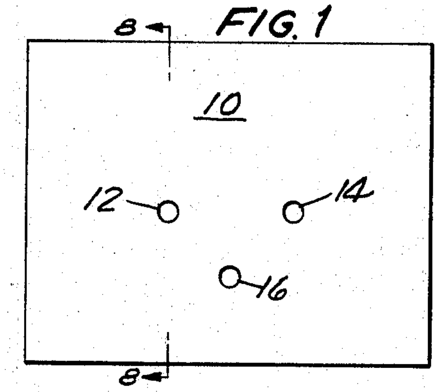

The carrier and coated slip are dried to remove volatile solvent. The carrier is peeled back and sheets of the desired size for FIG. 1 are cut from the self-sustaining green sheet. It is within the scope of the invention to use this base sheet either as a green leathery sheet or after firing. A particularly convenient range of thickness is from about 0.01 to 0.10 inches (0.25 to 2.5 mm.) after firing. It will be recognized that some economies in production may be effected by handling larger sheets equal to some multiple of FIG. 1 in size such as 2, 3, 4 or 6 or more. It will also be recognized that in some instances the ceramic base may be formed by dry-pressing or other techniques.

It will be seen in FIG. 1 that the green ceramic base 10 has three holes, 12, 14 and 16 therethrough spaced so as to receive (after firing) pins of a standard 0.200 inch diameter pin circle. This will then accommodate a transistor having a standard T0-5 outline. These holes may be punched when the sheet is cut or thereafter and, of course, are here exemplary of through holes passing through the base sheet. Pins of components or for insertion into suitable receptacles for connection thereto may be soldered in the holes. Composites built of fired bases generally require a ceramic base thickness of at least 10 mils to insure suitable handling strength and rigidity. Thinner base planes are provided by using unfired ceramic bases.

The base sheet may be of any desired thickness from about 1 mil. (0.0254 mm.) thick even up to 0.5 inches (12.7 mm.). For purposes of this example a fired base sheet which is the base for all subsequent screening operations is prepared by firing the green alumina sheet to maturity at 1,625° C. for 4 hours.

Figure 1A:
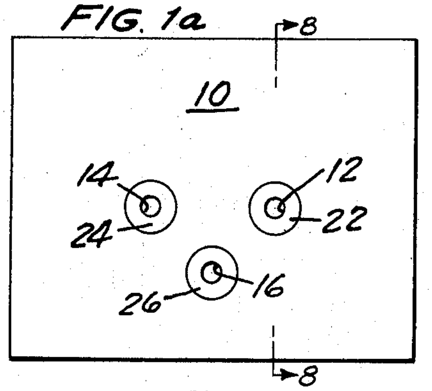

FIG. 1*a* shows the underside of sheet 10 with metal pads 22, 24 and 26 applied around holes 12, 14 and 16, respectively. In the process of screening, a small amount of the metallic paste passes through the hole, as shown at 15 in FIGS. 8 and 9, and is available to contact metallic paste applied on the other side. The paste is applied by squeegeeing through a suitable screen using a vacuum pull-through or by bore-coating to make contact through the holes. A lower viscosity paste may be used so that it will be easier to coat the walls of the holes.

Commercial metallizing pastes are suitable where temperatures for maturation of the ceramic are low enough so that the metals are refractory at temperatures of firing the ceramic structure. Copper and silver, which are desirable for electrical properties, melt too low to be incorporated directly in alumina ceramics and compositions based on tungsten or molybdenum are preferred. It is within the scope of the invention to employ different metallizing pastes for particular effects.

Figures 2, 4:
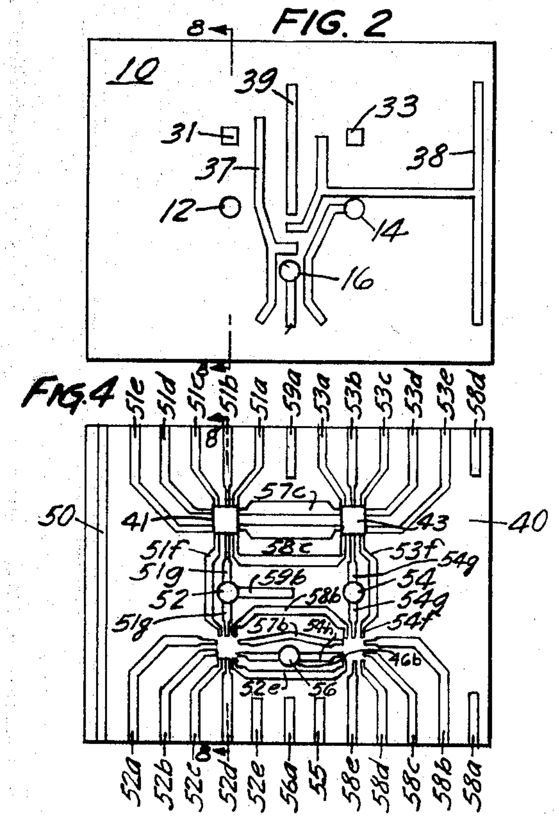
FIG. 2 shows a metallic pattern, applied to the upper surface of the ceramic base sheet of FIG. 1, and providing buried connections.
FIG. 4 shows a further metallic pattern applied atop the ceramic insulative layer of FIG. 3 and providing contact terminals along edges, i.e. marginal contacts.

Reverting again to the drawings, FIG. 2 shows a pattern of interconnections which are ultimately "buried" in the composite of the invention. Metallic pads 31 and 33 are ultimately bottom connections for electronic chips. Strips 35 and 36 connect through holes 14 and 16 respectively with spots on the underside of base 10 and carry leads to an area near one edge of the structure. A long strip 37 with one side arm also places a connection near the same edge of the structure and ultimately provides a triple connection. Strip 38 has four arms to locations as shown and hence provides a quadruple connection. Strip 39 provides a simple connection. Clearly the exact array of such buried connections can be varied to suit the problems of electrical design. The metal strips are shown in FIG. 2 very much enlarged. In general, widths may be from a narrow line of about 3 mils. (0.07mm.) upward to a continuous plane of the width of the base. Thicknesses are usually from about 0.4 to 3.0 mils. (0.01 to 0.07 mm.). Using molybdenum or tungsten based metallic pastes, resistances of metal patterns vary between about 1 and 50 ohms per square depending on the paste composition, particle size distribution and pattern thickness. Low resistance is usually desired, although some applications may desire the metal pattern to act as a resistor or as a heating element.

The metallized rings around the holes on the base ceramic are electrically connected through the base ceramic to the metal patterns shown in FIG. 2. This electrical connection may be accomplished by vacuum pull through during screening or by bore coating or other methods.

Commercial refractory metal powders suitable for screening are available from a number of sources and may be used as received, blended with screening media. The refractory metal powders may also be blended or milled to produce desirable particle size distribution, preferably below 5 microns. Nonorganic additives can be added to the refractory metal powder to enhance bond strengths or as sintering aids. It is important that additions to the refractory metal powders should not lower the sintering temperature of the metal below that of the ceramic. The ratio of metal powder and screening medium is not critical and may vary according to properties such as viscosity and the amount of metal desired to be deposited (electrical and camber considerations). A typical composition for a metallizing paste is 75 percent by weight molybdenum powder (less than 20 micron particle size and preferably with most particles less than 5 microns) and 25 percent by weight of a suitable screening medium. A mixture of 88 parts tungsten powder (of similar particle size) and 12 parts of a suitable screening medium can be used.

The critical feature of this invention is that intermediate insulative layers are also deposited by screen printing. The composition which is used is chosen to be compatible with the ceramic of the base. Preferred inorganic compositions for both ceramic base and insulative layers may comprise about 94 percent or more alumina or beryllia together with small amounts of respective mineralizers.

One such preferred composition comprises about 94 percent $Al_2O_3$ and about 6 percent of $SiO_2$ and MgO together. Another comprises about 99.5 percent $Al_2O_3$ and about 0.5 percent of other oxides particularly Mg. In each instance the inorganic composition is combined with a liquid vehicle and a suitable polymeric binder. Proportions may be varied depending on viscosities desired etc. For example 100 parts of 10 micron or less 94 percent alumina in 38 parts of a solution of 8 percent by weight ethyl cellulose in terpineol.

Figure 3:
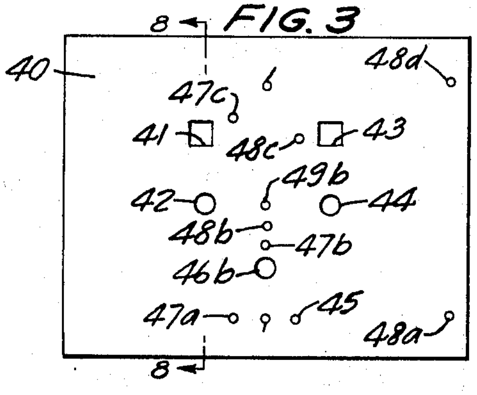
FIG. 3 shows a ceramic insulative layer applied to the ceramic base sheet of FIG. 1 over the metallic pattern of FIG. 2.

Using a compatible composition, insulative layer 40 in FIG. 3 is screened onto base 10 and covers the metallic pattern of FIG. 2 except at points where openings are left for connections. The bonding between the insulative layer or ply and the base sheet or ply is interrupted only by the buried metallic pattern. The thickness of layer 40 may be from 0.5 mil. (0.013 mm.) to 2 mils. (0.05 mm.). Thicker layers may be obtained by screening additional identical layers with or without drying in between. Spaces between metallic conductors are conveniently filled to give substantially uniform layers by screen-printing in register a negative or reverse image of the metallic pattern using the insulative composition. Alternatively slight compaction may be used to obtain levelled surfaces. In many instances levelling is not necessary. It is generally advantageous to screen insulations as two or more layers so that undesired pinholes occurring in one application are filled by a subsequent application. A suitable layer is 2 mils. (0.05 mm.) thick. Many of the ceramic compositions such as 94 percent and higher alumina, are substantially transparent in these thin layers after proper firing. In composites it is then possible to see one or more buried layers through the substantially transparent insulative layers. Square holes 41 and 43 are above metal pads 31 and 33 respectively and holes 42, 44 and 46*b* are above holes 12, 14 and 16 respectively. It will be noted that these last three holes all connect through to the back of base 10 and in addition holes 44 and 46*b* make connections into the buried connection layer of FIG. 2 (i.e., to 35 and 36 respectively) as does also hole 46*a*. The letters are used here and generally elsewhere to indicate connections, i.e. between 46*a* and 46*b*. In general, also, like digits, i.e., as 12, 22, 42, will indicate connections and the different tens indicate different levels of the structure. Likewise it will be seen that connector 37 is the buried connector for holes 47*a*, 47*b* and 47*c*, connector 38 for holes 48*a*, 48*b*, 48*c* and 48*d* and connector 39 for holes 49*a* and 49*b*.

The metallic pattern shown in FIG. 4 is applied over the insulative layer shown in FIG. 3 and is obviously much more complicated. In addition to certain interconnections at this level and connections to the back of the structure through insulative layer 40 and base 10, interconnections which cross leads at the level of FIG. 4 are provided by the buried connections at the level of FIG. 2. Contact is established by penetration of the metallic paste through the holes in layer 40. In addition leads are connected from fingers around two spaces for chips pad-mounted on layer 10 and bonded by the user in subsequent operations by wires to leads on layer 40 and for two chips face-bonded (by the user) to pads on layer 40. Each of the latter two chips has 10 fingers around the edges. The structure as a whole provides 26 connections around the edges plus three at the back and a possible three others on the top. Band 50 is a conductivity test line. Contacts to various connections may be by clip connector boards or by brazed or soldered connections as desired.

Referring now to FIG. 4, where holes 41 and 43 are indicated for convenience of reference, it will be seen that each is surrounded by a series of fingers connecting in various directions. Around holes 41 and 43 leads radiate to metal contacts 51*a*, 51*b*, 51*c*, 51*d*, 51*e* and 53*a*, 53*b*, 53*c*, 53*d* and 53*e*, respectively, along the top margin of the ceramic structure. Two other positions serves as the centers for a series of connections of which 52*a*, 52*b*, 52*c*, 52*d*, 54*a*, 54*b*, 54*c*, 54*d* lead to metal contacts along the lower margins of the ceramic structure.

Leads between pairs of the four locations for chips are designated by the pairs of fingers 51*f* and 52*f*, 52*e* and 54*e*, 53*f* and 54*f*, and 51*h* and 53*h*. Other connections between pairs of the chip locations further connect by way of holes shown in FIG. 3 to buried connectors, i.e., in the layer of FIG. 2. Metallic strip connections 57*b* and 57*c* connect two pairs of chip locations through holes 47*b* and 47*c* of the insulative layer of FIG. 3 to connector 37 of FIG. 2 which in turn connect through hole 47*a* to marginal metal contact 57*a*. Similarly metallic strip connections 58*b* and 58*c* connect through holes 48*b* and 48*c* to connector 38 and thus through holes 48*a* and 48*d* to metal contacts 58*a* and 58*d*. Lower metal contacts 55, 56*a* and upper contact 59*a* connect through holes 45, 46*a* and 49*a* to buried connectors 35, 36 and 39 respectively.

From buried connector 35 conductive paths lead through hole 14 in plate 10 to base terminal 24 and through hole 44 in layer 40 to node 54 in connector 53*g* to 54*g*.

From buried connector 36 leads pass through hole 16 in plate 10 to base terminal 26 through hole 46*b* in layer 40 to node 56 in connector 52*h* to 54*h*.

From buried connector 39 a circuit leads through hole 49*b* to connector 59*b* and then through node 52 to contacts 51*g* and 52*g* and also through node 52 via holes 42 and 12 to base contact 22.

It will be apparent from the drawings and this description that various combinations of connections are possible as between 2, 3, 4 more leads in one, two, three or more planes and that crossing of leads and connections can be effected in any situation by simple variations in the procedures herein taught.

In order to protect the surface of the layer of FIG. 4 and to provide a nonconducting base for metallized seal rings the insulative pattern of FIG. 5 is imposed on the ceramic base on top of the pattern of FIG. 4. The layer is suitably 1—2 mils. (0.025 to 0.050 mm.) thick. There are three unconnected ceramic areas 65, 62*b* and 64*b*. These areas are integrally bonded through intermediate insulative layers to the base sheet 10 except where metallic circuit elements are buried. The first ceramic area, is rectangular and has two holes 61 and 63 centered over but larger than holes 41 and 43 so that ends of the leads therearound are exposed as well as the metallic pads 31 and 33. The other two ceramic areas 62*b* and 64*b* have centrally located square holes 62*a* and 64*a* respectively providing a recess for other electronic chips. Because it may be convenient or desirable to solder or braze covers over the devices mounted in the four square holes 61, 62*a*, 63 and 64*a*, square metallic rims 71, 72*a*, 73, 74*a*, are provided therearound respectively. It will be noted that those rims are completely insulated from metallic circuits in the device but it would not be impossible or even difficult to provide connections thereto if desired.

FIG. 8 shows a cross section of the above layers assembled in a substrate. The several layers are indicated by lines of separation although it will be understood that after firing the ceramic is integrally bonded and is monolithic. The thicknesses of the various layers are not necessarily related to the thicknesses shown nor to the same horizontal scale in either FIG. 8 or 9.

After preliminary heating, for example, up to 600° C. for 1 hour, to remove organic binders, the entire composite structure of the ceramic base with unfired metallic patterns and insulative layers thereon, is heated at about 1,630° C. for 2 hours in an atmosphere of hydrogen and nitrogen in order to sinter the metal and ceramic constituents. Other firing temperatures are used for other ceramics having different maturing temperatures and consistent with metallizing compositions. A nonoxidizing atmosphere is used with refractory metals but platinum and palladium pastes may be fired in air on lower temperature ceramics such as barium titanate.

Nickel, gold or other metals may be applied electrolytically or by electroless plating to provide metallic terminals for electrical connections.

In the above-mentioned example a fired ceramic base is employed and most of the added layers are on the one side, i.e., the obverse. A fired base provides adequate rigidity so that neither drying of the successive metallic patterns and insulative ceramic layers nor firing produces shrinkage in the plane of the structure. There is a small shrinkage in thickness when the screened layers are fired. Under some conditions where several insulative and conductive layers are included some camber may be introduced on firing.

It is sometimes convenient to employ an unfired base and fire the entire structure resting on a setter plate at one time. It is then found to be quite difficult to balance compositions of ceramic base, and ceramic and metallic screening pastes on the obverse of the base so that no deformation or camber is introduced into the finished ceramic composite. Whether a fired or unfired base is used, a solution to overcome the problem is to provide a metallic layer on the reverse in such a position that it opposes any distortion due to the patterns of the obverse. The layer may be entirely isolated and be functionless or may serve as a ground, a shield or other purpose. In general, the area and disposition of the metal layer on the reverse is selected to be similar in area and thickness combined to the layers applied on the obverse. For example, patterns may be applied symmetrically on the reverse of the base as well as on the obverse. The counterbalancing reverse metal layer is then buried by reproducing the back surface of the base where that requires a significant pattern or the counterbalancing layer may be left exposed.

Referring to FIG. 6 the back of sheet 10 is shown with holes 12, 14 and 16 and with a metal pattern 18 imposed thereon. It will be seen that metal pattern 18 does not extend to the edges of base 10 or to the edges of holes 12, 14 or 16. FIG. 7 shows insulative layer 20 applied to and covering the base with metal pattern of FIG. 6. It will be noted that holes 12, 14 and 16 remain and metal contacts 22, 24 and 26 are screened therearound in analogy to FIG. 1*a*.

FIG. 9 shows in cross section a substrate as described above including a counterbalancing layer. Lines between layers are for convenience in recognition of parts because the fired ceramic is monolithic.

I claim:

1. A multilayer ceramic substrate having the ceramic layers integrally unified by firing to maturity a green ceramic body of like configuration consisting essentially of self-sustaining planar base stratum having screen-printed thereon on a first surface:

A. a first metallic pattern including a multiplicity of narrow metallic conductors at least about 0.003 inches wide and from about 0.0004 to 0.003 inches thick;

B. a first insulative layer, about 0.0005 to 0.002 inches thick, of the same ceramic composition as said base stratum, generally congruent with said base stratum and with openings positioned over and for connection to predetermined ones of said conductors;

C. at least one further metallic pattern on said first insulative layer comprising a multiplicity of narrow metallic conductors at least about 0.003 inches wide and from about 0.0004 to 0.003 inches thick covering and penetrating openings in said insulative layer to said first metallic pattern;

D. and at least one further insulative layer over at least a part of one said further metallic pattern; and on the second surface of said planar base stratum, E. a metallic pattern essentially symmetrical in area and total thickness to the total of the circuitry of the first metallic pattern and further patterns on said first surface of said planar base stratum.

2. A multilayer ceramic according to claim 1 wherein the metallic pattern on the second surface of the base stratum is isolated from electrical connection or contact with metallic patterns in the first surface.

UNITED STATES PATENT OFFICE
CERTIFICATE OF CORRECTION

Patent No. 3,549,784 Dated December 22, 1970

Inventor(s) Billy M. Hargis

It is certified that error appears in the above-identified patent and that said Letters Patent are hereby corrected as shown below:

Column 4, line 15, "Mg" should read --MgO--.

Column 6, line 10, "above mentioned" should read --above described--. The figure on the covering page should appear as shown below:

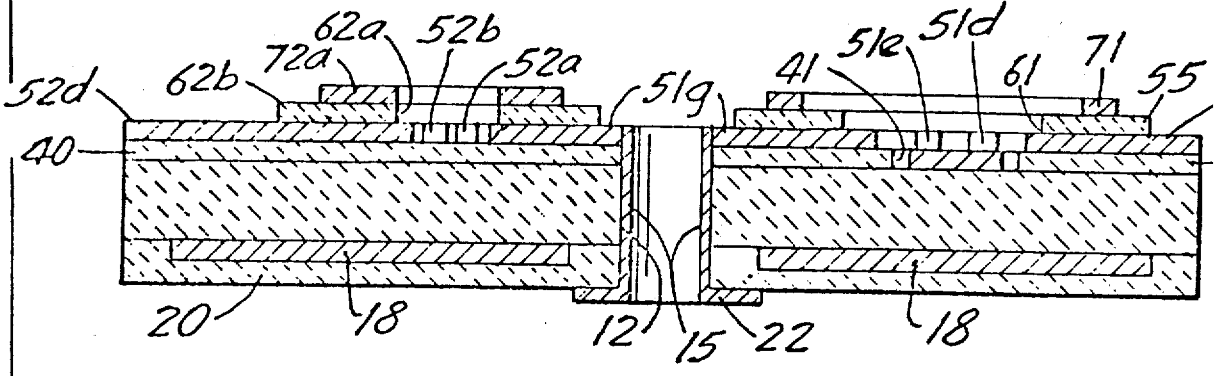

Signed and sealed this 6th day of July 1971.

(SEAL)
Attest:

EDWARD M.FLETCHER,JR.
Attesting Officer

WILLIAM E. SCHUYLER, JR.
Commissioner of Patents